United States Patent [19]
Barnett et al.

[11] Patent Number: 5,783,295
[45] Date of Patent: Jul. 21, 1998

[54] POLYCRYSTALLINE SUPPERLATTICE COATED SUBSTRATE AND METHOD/APPARATUS FOR MAKING SAME

[75] Inventors: Scott A. Barnett, Evanston; William D. Sproul, Palantine; Ming-show Wong, Northbrook; Xi Chu, Evanston, all of Ill.

[73] Assignee: Northwestern University, Evanston, Ill.

[21] Appl. No.: 675,797

[22] Filed: Jul. 5, 1996

Related U.S. Application Data

[63] Continuation of Ser. No. 973,390, Nov. 9, 1992, abandoned.

[51] Int. Cl.$^6$ ............................................. B32B 7/02
[52] U.S. Cl. .................. 428/216; 428/469; 428/472; 428/697; 428/698; 428/699; 428/701; 428/702; 428/704
[58] Field of Search ........................... 428/216, 472, 428/469, 698, 697, 699, 701, 702, 704

[56] References Cited

U.S. PATENT DOCUMENTS

| | | | |
|---|---|---|---|
| Re. 32,111 | 4/1986 | Lambert et al. | 428/216 |
| 4,554,201 | 11/1985 | Andreev et al. | 428/698 |
| 4,643,951 | 2/1987 | Keem et al. | 428/699 |
| 4,835,062 | 5/1989 | Holleck | 428/469 |
| 4,895,770 | 1/1990 | Schintlmeister et al. | 428/457 |
| 4,984,940 | 1/1991 | Bryant et al. | 428/698 |
| 5,075,181 | 12/1991 | Quinto et al. | 428/472 |

OTHER PUBLICATIONS

Holleck and Schulz, "Preparation and Behaviour of Wear-Resistant TiC/TiB$_2$ and TiC/TiN Coatings with High Amounts of Phase Boundaries" *Surface and Coating Technology*, 36 (1988) pp. 707–714.

"Ion Irradiation Effects During Growth of Mo/V(001) Superlattices by Dual-Target Magnetron Sputtering"; J. of Crystal Growth 121 (1992) pp. 399–412; Hakansson et al.

*Primary Examiner*—Archene Turner
*Attorney, Agent, or Firm*—Banner & Witcoff, Ltd.

[57] ABSTRACT

The present invention provides a coated article comprising a substrate that can be non-crystalline or crystalline such as a polycrystalline engineering material, having advantageous mechanical properties and a superlattice-type protective composite coating on the substrate. The composite coating comprises a plurality of vapor deposited, ion bombarded, polycrystalline layers of different adjacent compositions formed one atop the other in lamellar manner. The polycrystalline layers have sufficiently thin individual layer thicknesses (e.g. not exceeding about 150 nanometers) and sufficiently distinct and different compositions proximate their interfaces despite being ion bombarded as to constitute superlattice layers that exhibit a collective hardness exceeding the hardness of any individual layer material in homogenous or bulk form. The composite coating is ion bombarded to an extent that the individual layers are substantially free of intragranular voids without adversely affecting the compositional modulation of the superlattice layers. Moreover, the composite coating can have planar or non-planar interlayer interfaces and still exhibit substantially improved hardness.

9 Claims, 13 Drawing Sheets

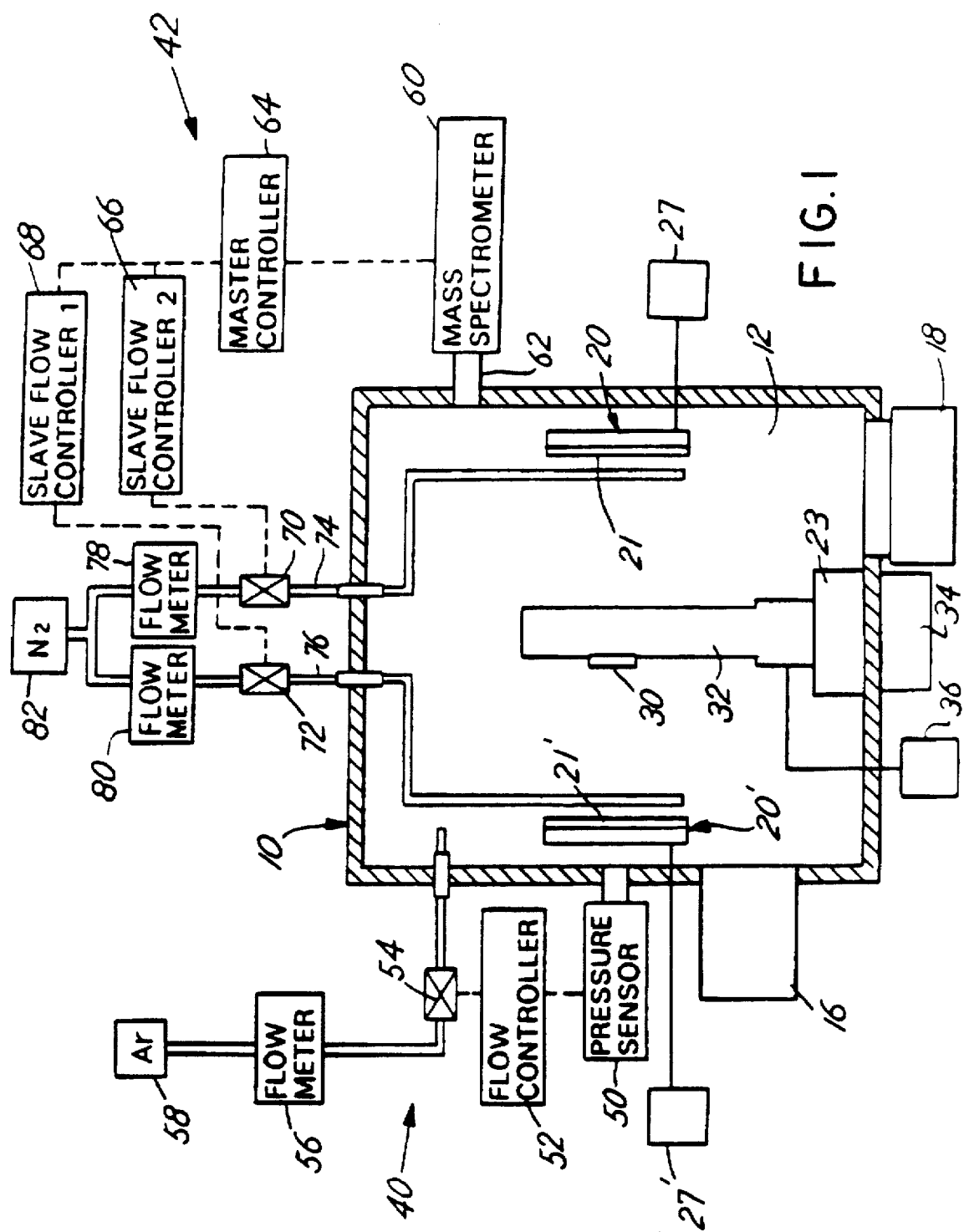

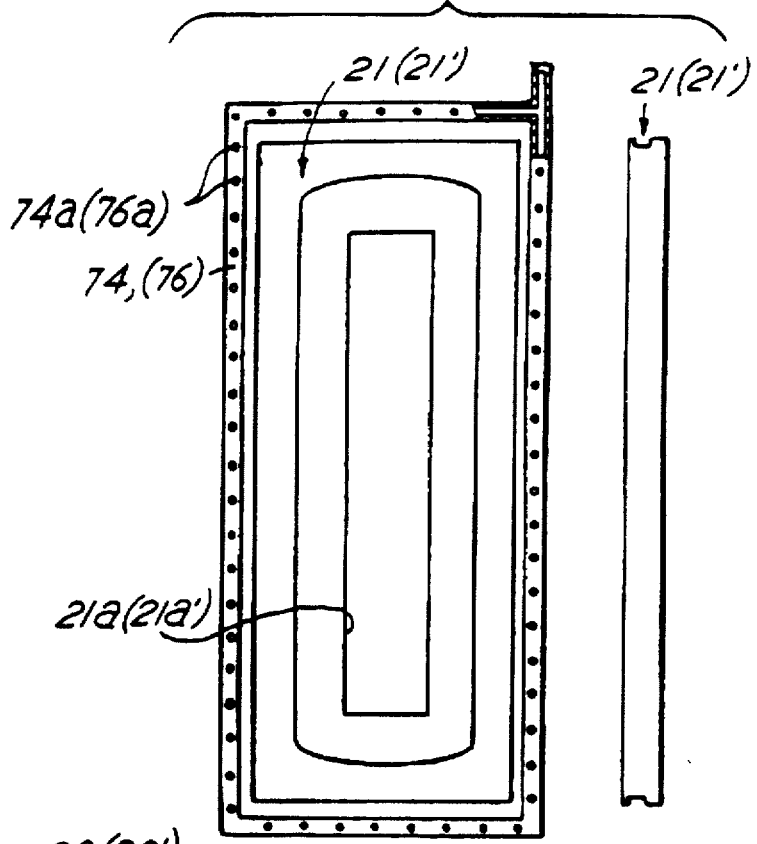
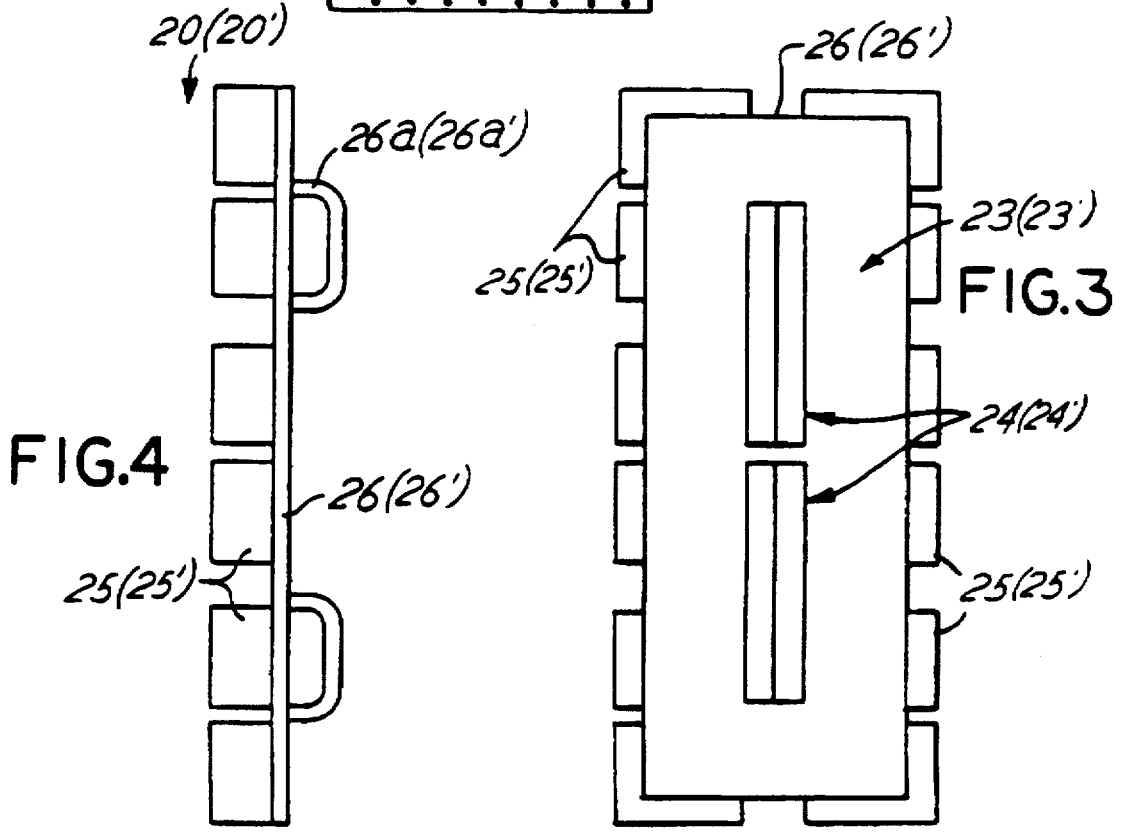

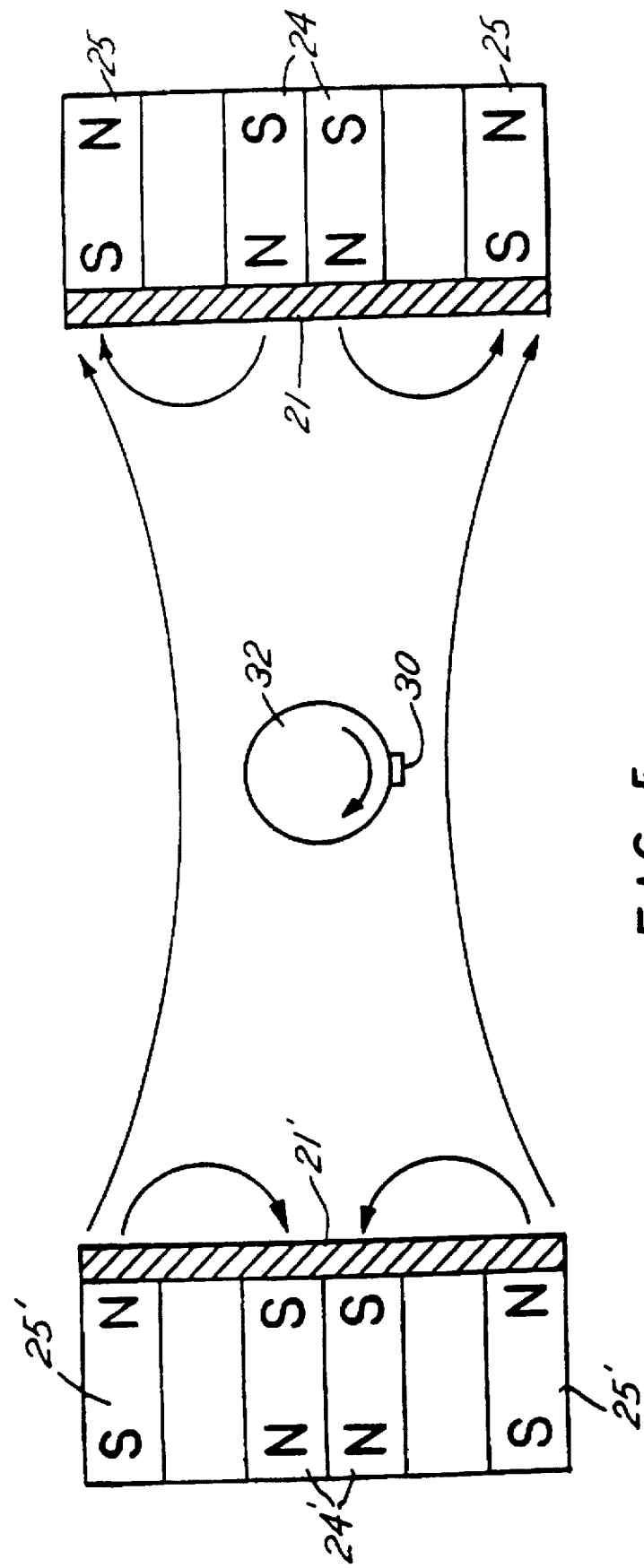

POLYCRYSTALLINE SUPPERLATTICE COATED SUBSTRATE AND METHOD/APPARATUS FOR MAKING SAME

This application is a continuation of application Ser. No. 07/973,390, filed Nov. 9, 1992, now abandoned.

CONTRACTUAL ORIGIN OF THE INVENTION

This invention was made with Government support under Grant Number: DE-FG02-90ER 45434 and awarded by the U.S. Department of Energy. The Government may have certain rights in the invention.

FIELD OF THE INVENTION

The present invention relates generally to engineering materials and, more particularly, to coated engineering materials, especially polycrystalline materials, having a protective composite coating comprising a series of vapor deposited, ion bombarded, polycrystalline superlattice layers formed thereon in a manner to exhibit high hardness while retaining the advantageous mechanical properties of the underlying substrate material. The invention also involves apparatus and methods for making such a coated material.

BACKGROUND OF THE INVENTION

Considerable attention has been focused on providing protective wear resistant coatings for cutting tools, forming tools, molding tools, gas turbine engine air-foils, and other components subject to wear, abrasion, and/or erosion in service. For such service applications, the hardness and adherence of the protective coating is important.

Transition metal nitrides, especially TiN, have been used as protective coatings for cutting tools. The materials factors governing the performance of TiN coatings include coating hardness, interfacial chemistry, coating-to-substrate adhesion, and coating ductility. Attempts to improve upon the properties of polycrystalline TiN coatings have included variations in deposition conditions as described, for example, by Petrov et al. in Thin Solid Films, 169, 299 (1989), by Sproul et al. in Thin Solid Films, 171, 171 (1989), and by Sproul et al. in Surface and Coatings Technology, 39/40, 355 (1989). Doping and alloying of polycrystalline TiN coatings also have been used to this same end as described by Sproul in Surface and Coatings Technology, 36, 191 (1989), by Hakansson et al. in Thin Solid Films, 153, 55 (1987), by Munz et al. in J. Vac. Sci. Technol., A 4, 2717 (1986), and by Knotek et al. in J. Vac. Sci. Technol., A 6, 2149 (1988).

In the cutting tool industry, attempts have been made to improve coating properties and performance by employing a multilayer coating comprising different materials. Multilayer ceramic coatings having only a few layers and/or relatively large layer thicknesses such as, for example, greater than 0.1 micron have been used. An approximately 10% increase in coating hardness has been achieved for a $TiC/TiB_2$ coating for a bi-layer repeat period of 0.75 micron as described by Movchan et al. in Thin Solid Films, 97, 215 (1982).

Experimental work on so-called "superlattice" coatings has involved epitaxially growing a series of extremely thin (e.g. superlattice period, $\Lambda=0.75-32$ nanometers), single crystal layers of different compositions on single crystal substrates, such as single crystal MgO (100), to provide a total coating thicknesses of approximately 2–3 microns. For example, a series of single crystal transition metal nitride superlattice layers comprising TiN/VN in alternating sequence have been epitaxially grown on MgO (100) substrates by reactive magnetron sputtering to a total coating thickness of about 2.5 microns as described by Helmersson et al. in J. Appl. Phys. 62, (2), Jul. 15, 1987. The superlattice coating produced was found to exhibit hardness levels 2–3 times the hardness of the individual transition metal nitride layers in homogenous or bulk form. For example, the superlattice coating exhibited a hardness of $5560\pm600$ $kg/mm^2$ as compared to 2200 $kg/mm^2$ and 1620 $kg/mm^2$. As is apparent, this work involved single crystal superlattice layers epitaxially grown on single crystal MgO (100) substrates in order to provide a good match to both the lattice constant and thermal expansion coefficient of TiN. Similar superlattice coating results using similar coating procedures are described by Mirkarimi et al. in Appl. Phys. Lett., 57, (25), 2654 (1990).

It is an object of the present invention to provide apparatus and method for forming a polycrystalline superlattice-type composite coating having improved hardness on substrates of various types, crystalline and non-crystalline, especially on polycrystalline substrates representative of a wide variety of commonly used engineering materials such as, for example, metals, alloys, composites such as cemented carbides, ceramics and the like for improving the useful service life of such materials.

It is another object of the present invention to provide apparatus and method for forming a polycrystalline superlattice-type composite coating having improved hardness on substrate materials wherein the coating conditions permit retention of the advantageous mechanical properties of the underlying substrate material.

It is another object of the present invention to provide a coated substrate, especially a polycrystalline substrate representative of a wide variety of commonly used engineering materials, having a polycrystalline superlattice-type composite coating formed thereon in a manner to exhibit substantially improved coating hardness as compared to homogenous (bulk) forms of the individual layer materials.

It is another object of the present invention to provide a coated substrate having a polycrystalline superlattice-type composite coating exhibiting substantially improved coating hardness regardless of morphology of the layer interfaces.

SUMMARY OF THE INVENTION

The present invention provides a coated article comprising a substrate that can be non-crystalline or crystalline, such as a polycrystalline engineering material, having advantageous mechanical properties and further comprising a polycrystalline superlattice-type protective composite coating on the substrate. The composite coating comprises a plurality of vapor deposited, ion bombarded, polycrystalline layers of different adjacent compositions formed one atop the other in lamellar manner. The polycrystalline layers have sufficiently thin individual layer thicknesses (e.g. not exceeding about 150 nanometers) and sufficiently distinct and different compositions proximate their interfaces despite being ion bombarded as to constitute superlattice layers that exhibit a collective hardness exceeding the hardness of any similarly formed individual layer material in homogenous or bulk form. The polycrystalline superlattice layers are ion bombarded to an extent that the layers are substantially free of intergranular voids without adversely affecting the compositional modulation of the layers.

The composite coating can have planar or non-planar interlayer interfaces and still exhibit improved hardness.

In one embodiment of the invention, the coated article comprises a polycrystalline substrate and a composite coating comprising a plurality of vapor deposited, ion bombarded, polycrystalline ceramic superlattice layers thereon. The ceramic layers are selected from a nitride layer, carbide layer, oxide layer, boride layer and combination thereof, such as carbonitride, oxynitride, and like layers. The ceramic layers can comprise any combination of ceramic layers formed one atop the other to achieve a desired composite coating hardness.

The present invention also involves a method and apparatus for making the coated article described hereabove wherein a material is vapor deposited on a substrate under conditions to grow a polycrystalline superlattice layer and ion bombard the layer as it is grown on the substrate, and a material of a different composition is vapor deposited on the previously deposited layer under conditions to grow an ion bombarded, polycrystalline superlattice layer with a different composition. Vapor deposition of such ion bombarded, polycrystalline superlattice layers of different composition one atop the other is repeated as necessary to form a plurality of polycrystalline superlattice layers in lamellar manner having sufficiently thin individual layer thicknesses and sufficiently distinct and different compositions proximate their interfaces despite being ion bombarded as to exhibit a high collective coating hardness. Deposition of the layers is effected under relatively low substrate temperature conditions that permit retention of advantageous mechanical properties of the substrate; e.g. retention of properties attributable to heat treatments such as tempering, precipitation hardening, and the like.

One method embodiment of the invention involves forming a composite coating by reactive sputter deposition including sputtering a material (e.g. a metal) from a target in a coating chamber while a partial pressure of a gas reactive with the material is maintained proximate the target to form a compound of the material, depositing the compound on the substrate as an ion bombarded, polycrystalline superlattice layer, sputtering a material of a different composition from another target in the coating chamber while a partial pressure of a reactive gas reactive is maintained proximate that target independent of the other gas partial pressure to form a compound of different composition, and depositing the compound on the previously deposited polycrystalline layer to form a second ion bombarded, polycrystalline superlattice layer on the substrate, and repeating the steps as necessary to form additional ion bombarded, polycrystalline superlattice layers on the substrate that collectively exhibit high hardness. Substrate temperatures below 500° C. are involved during coating so as to retain beneficial substrate properties.

In this method embodiment of the invention, the sum of the partial pressures preferably is maintained substantially constant in the chamber during deposition of the coating. The superlattice layers preferably are ion bombarded at a sufficient ion current density that the layers are substantially free of intergranular voids without disrupting the compositional modulation of the layers to an adverse extent. The substrate typically is rotated between the targets at a speed to control the thicknesses of the deposited superlattice layers.

One apparatus in accordance with the invention for reactive sputtering the composite coating on a substrate comprises a plurality of targets in a coating chamber, means for generating a plasma in the chamber effective to sputter material form each target, means for introducing reactive gas proximate at least two targets during sputtering, and means for independently controlling the partial pressure of the reactive gas proximate the targets. Preferably, the partial pressures are independently controlled at different targets by a closed loop feedback control system including means for sensing the composition of the reactive gas in the chamber during sputtering to provide a control signal which varies as a function of the amount of the reactive gas in the chamber, master control means responsive to the control signal of the sensing means, and a plurality of slave control means each responsive to the master control means and operably associated with a respective gas control valve for independently controlling a respective gas flow valve at each target.

The aforementioned objects and advantages of the present invention will become more readily apparent from the following detailed description and the drawings.

DESCRIPTION OF THE DRAWINGS

FIG. 1 is a schematic view of an opposed dual-cathode unbalanced magnetron sputter deposition apparatus in accordance with one apparatus embodiment of the invention for practicing a reactive sputter method embodiment of the invention.

FIG. 2 is a front elevation of one cathode target of the apparatus of FIG. 1 with a reactive gas supply conduit shown, the other opposing cathode target being identical except for composition.

FIG. 3 is a front elevation of one magnetron, the other opposing magnetron being identical except that the opposing magnet poles have opposite polarity.

FIG. 4 is an exploded side elevation of one cathode target and associated magnetron.

FIG. 5 is a schematic top view of the unbalanced magnetron cathodes of FIG. 1.

DETAILED DESCRIPTION OF THE INVENTION

Figure 6:
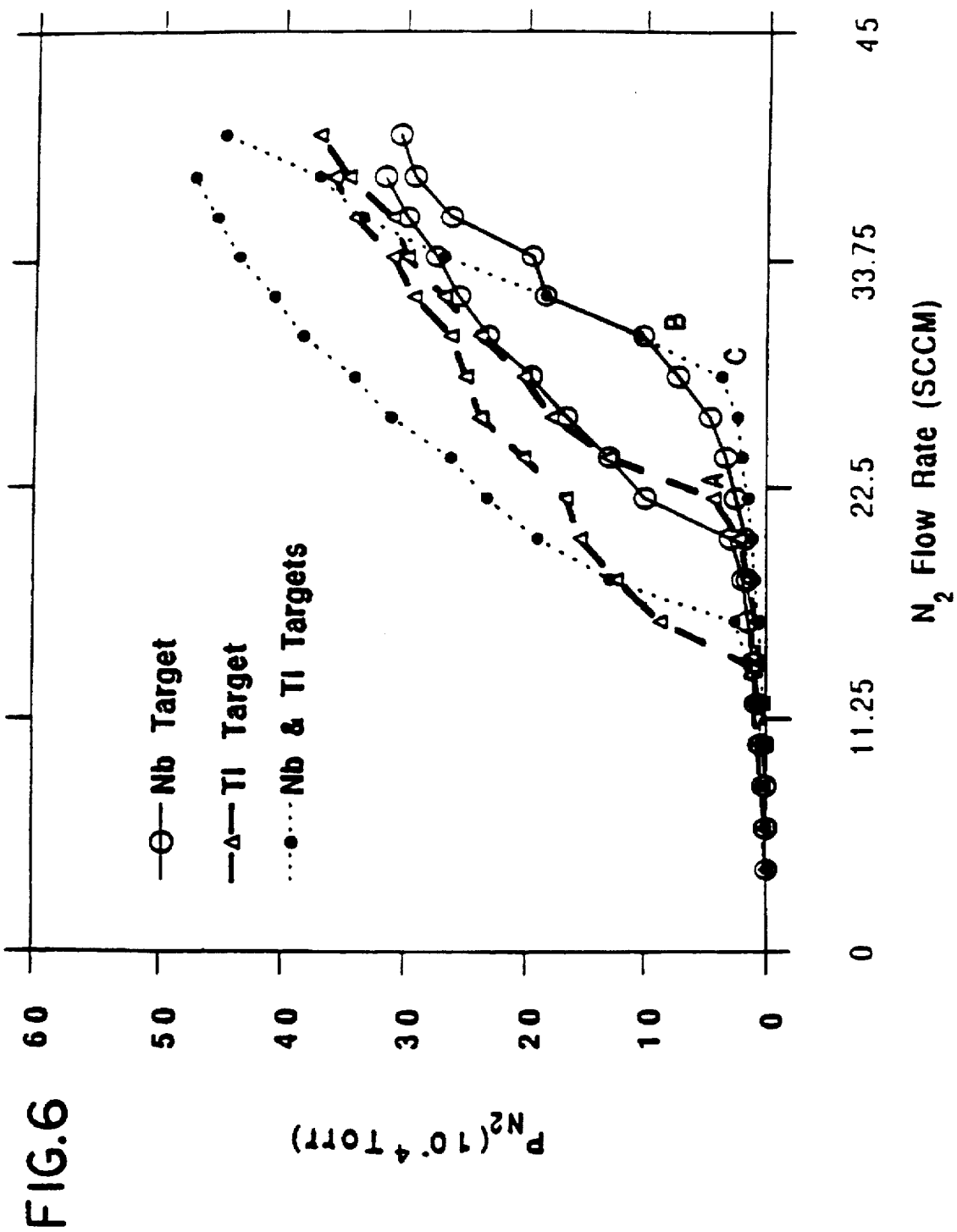
FIG. 6 is a graph of partial pressure of nitrogen as a function of $N_2$ flow during deposition from a) only the Ti target, b) only the Nb target, c) the Ti and Nb targets simultaneously at operating conditions of $PAr+N_2=8\times10^{-3}$ Torr and constant target power=5 kW/per target.

For purposes of illustration and not limitation, the polycrystalline superlattice-coated substrate of the invention will be described herebelow as being formed by reactive sputter deposition using certain apparatus and method embodiments of the invention. However, the invention is not limited to the particular apparatus and method embodiments disclosed herebelow or to the particular ion bombarded, polycrystalline superlattice coatings formed. For example, other vapor deposition apparatus and methods such as cathodic arc, evaporation, ion plating, and plasma enhanced chemical vapor deposition with ion bombardment of the coating can be employed to form ion bombarded, polycrystalline superlattice-type composite coatings on substrates in accordance with the invention. Moreover, composite coatings in accordance with the invention are not limited to the specific ceramic/ceramic and metal/ceramic superlattice multi-layers described here-below but rather can comprise multi-layers of various materials including metals, alloys, ceramics, and diamond in appropriate numbers and sequences to obtain polycrystalline superlattice coatings having desired hardness properties.

Referring to FIGS. 1–5, an opposed-cathode, unbalanced magnetron reactive sputtering apparatus is schematically illustrated as including a stainless steel coating vessel 10 defining a vacuum coating chamber 12 (about 66 centimeters in diameter and 70 centimeters in height). The chamber 12 is evacuable to high vacuum levels (e.g. 1×10$^{-6}$ Torr) by a 2400 liter/second diffusion pump backed by a 38 liter/second mechanical pump designated collectively by reference numeral 16 and/or by a 1500 liter/second turbomolecular pump backed by a roots blower and mechanical pump combination having a combined pumping speed of 68 liters/second and designated collectively by reference numeral 18. The coating vessel 10 is surrounded by a water jacket (not shown). When the chamber 12 is open and during vessel pumpdown (evacuation), hot water is pumped through the jacket to reduce the amount of water vapor accumulated on the internal vessel walls. During coating deposition, cold water is pumped through the jacket to reduce the amount of water vapor released from the internal vessel walls.

The apparatus includes opposing (facing) planar magnetron cathodes 20, 20' of like construction (except for magnet polarity) supported in chamber 12 by cathode support housings (not shown) mounted on the walls of the vessel 10 so that the cathodes are separated by a distance of 28 centimeters. The magnetron cathodes 20, 20' are shown in more detail in FIGS. 2–5 as comprising respective race track-shaped metal targets 21, 21' having a rectangular outer profile (12.1×38.1 centimeters) and a central opening 21a, 21a'. The targets 21, 21' are received in respective tracks 23, 23' of the cathodes. The tracks 21, 21' are defined by respective longitudinally aligned pairs 24, 24' of AlNiCo magnets that occupy the openings 21a, 21a' in the targets and outer, peripheral NdFeB magnets 25, 25' supported on soft iron back plates 26, 26' having handles 26a, 26a'. The outer, peripheral NbFeB magnets 25, 25' provide a stronger magnetic field than the weaker AlNiCo magnets 24, 24'. The opposing poles of the magnets 24, 24' and the opposing poles of the magnets 25, 25' are arranged to have opposite polarity to provide a so-called opposed or closed-field configuration wherein the magnetic field lines are linked between the cathodes 20, 20' as schematically illustrated in FIG. 5 so as to increase the ion current density to the substrate to be coated. Dual unbalanced magnetron cathodes of the type described are available from Material Research Corporation (MRC) under the trademark INSET planar magnetron cathodes. Such magnetron cathodes are disclosed by Sproul et al. in Surface and Coatings Technology, 43/44, 270–278 (1990) and Rohde et al. in Surface and Coatings Technology, 50, 255–262 (1992), the teachings of both of which are incorporated herein by reference. Each target 21, 21' receives electrical power from a respective 20 kW DC power supply 27, 27'.

A substrate 30 to be coated is mounted on a cylindrical substrate holder 32 located equidistant from each target 21, 21'. The substrate holder 32 is rotatable by a suitable electric motor 34 located outside the vessel 10 at the bottom of the vacuum chamber. The motor 34 includes a drive shaft (not shown) extending sealingly through the vessel wall to drive a substrate holder drive gear/chain mechanism 23 (shown schematically) to rotate the holder 32. The rotational speed of the substrate holder and the target power determine the period, Λ, of the superlattice layers formed one atop the other as a lamellar composite coating on the substrate 30. For the magnetron cathode dimensions set forth hereabove, the substrate holder 32 has a diameter of 12.7 centimeters and height of 40 centimeters. The substrate holder diameter is selected to be greater than the lateral dimension of the targets to minimize line-of-sight cross-contamination of one target by the other and contamination of the superlattice layers being formed proximate each target by sputtered flux from the other target. The substrate holder and substrate are electrically biased by a 5 kW DC power supply 36 (or an optional 3 kW RF power supply) in order to effect initial substrate etching for substrate surface cleaning purposes and subsequent negative substrate biasing during coating deposition. A constant electrical power level is supplied to the substrate 30 during coating deposition in accordance with U.S. Pat. No. 4,428,811, the teachings of which are incorporated herein by reference. The substrate 30 is heated only by interaction with the plasma during sputter deposition, although a substrate heater device could be employed if desired.

To achieve high-rate reactive sputtering of ion bombarded, polycrystalline ceramic/ceramic or metal/ceramic superlattice layer sequences on the substrate 30, reactive sputtering is conducted in an inert gas/reactive gas (e.g. Ar/N$_2$) atmosphere using an automatic, closed loop feedback control system 40 to maintain a constant total inert gas/reactive gas (e.g. Ar/N$_2$) pressure in the coating chamber 12 via inert gas (e.g. Ar) partial pressure adjustment and an automatic, closed loop feedback control system 42 to independently control reactive gas (e.g. N$_2$) partial pressure proximate each target 21, 21' and to maintain the sum of the reactive gas partial pressures substantially constant during sputtering.

The pressure control system 40 comprises a capacitance manometer sensor 50 available under the trademark BARATRON from MKS Instrument, Inc. connected to a flow controller 52 also available from MKS Instrument, Inc. as model 260MFC mass flow controller. The flow controller 52 regulates an inert gas flow valve 54 to admit inert gas to the coating chamber 12 from a conventional mass flow meter 56 to maintain a constant total inert gas/reactive gas (e.g. Ar/$N_2$) pressure. Mass flow meter 56 receives ultra high purity inert gas (e.g. greater than 99.999% pure Ar) from a conventional source 56, such as an inert gas cylinder or bottle. A total gas pressure control system of the type described is disclosed by Sproul et al. in Thin Solid Films, 171, 171 (1990), the teachings of which are incorporated herein by reference.

The reactive gas (e.g. $N_2$) partial pressure control system 42 comprises a differentially pumped quadruple mass spectrometer 60 available as QUADREX 100 mass spectrometer from Leybold Inficon Inc. communicated to the coating chamber 12 by conduit 62 to sample the sputtering atmosphere during coating deposition and provide a control signal which varies as a function of the concentration of the reactive gas (e.g. $N_2$) in the chamber 12. Alternately, an optical gas controller (not shown) also available from Leybold Inficon Inc. can be used to this same end. The sampling conduit 62 is located equidistantly from the targets 21, 21' for sampling purposes (conduit 62 is shown out of position in FIG. 1 for the sake of convenience and clarity of other features in that Figure).

The mass spectrometer 60 determines (senses) the inert gas and reactive gas partial pressures during coating deposition and, as mentioned, generates a control signal which varies as a function of the reactive gas partial pressure in the coating chamber 12.

The control signal is supplied to a master controller 64 available as model 260MFC from MDS Instrument, Inc. The master controller 64, in turn, is interfaced to separate slave flow controllers 66, 68 also available as model 10 26OMFC from MKS Instrument, Inc. The slave flow controllers 66, 68 regulate respective flow control valves 70, 72 that control flow of the reactive gas through supply conduits 74, 76 from respective mass flow meters 78, 80 and a source 82 of ultra high purity reactive gas (e.g. greater than 99.999% pure $N_2$). As shown best in FIGS. 1 and 4, the conduits 74, 76 extend in front of the respective target 21, 21' (e.g. by a distance of 2 centimeters) and have a rectangular peripheral profile complementary to that of the respective target, although slightly enlarged. The conduits 74, 76 include 0.5 milimeter diameter perforations spaced apart by 5 centimeters along the portions of the conduits in front of each target, to supply the reactive gas proximate thereto for reaction with the material sputtered from the targets.

The slave flow controllers 66, 68 are responsive to the master controller 64 to independently control the reactive gas flow and thus partial pressure proximate each target 21, 21' during sputtering of material from each the target 21, 21'. The slave flow controllers 66, 68 can control the valves 70, 72 to maintain different partial pressures at each target 21, 21' as necessary to form different superlattice compositions, stoichiometric or non-stoichiometric, in front of each target for deposition on the substrate 30. The slave flow controllers 66, 68 can maintain the ratio of reactive gas partial pressure between the targets substantially constant such that the sum of those partial pressures also will be maintained substantially constant. This control of the sum of the reactive gas partial pressures at a constant level is advantageous to achieve high rate sputter deposition of the superlattice layers wherein deposition is conducted at the optimum position (e.g. at the knee) of the hysteresis curve of reactive gas (e.g. nitrogen) partial pressure versus reactive gas flow rate as described in U.S. Pat. No. 4,428,811 and in Thin Solid Films, 171, 171 (1990), the teachings of both of which are incorporated herein by reference.

The invention is useful in coating substrate materials of various types, crystalline and non-crystalline, with a plurality of ion bombarded, poly-crystalline superlattice layers one atop the other in a lamellar manner such that the superlattice layers collectively have a hardness greater than that of any layer material in homogneous or bulk form of comparable thickness. For example, the invention is especially useful in coating polycrystalline materials representative of a wide variety of commonly used engineering materials such as metals, alloys, composites, and ceramics. Of particular interest and importance are materials used in fabrication of machining tools, forming tools, and molding tools (e.g. tool steels, cemented carbides (WC in a Co binder), and ceramics) and other myriad components that are subjected to wear, abrasion, and/or erosion in service, such as for example, bearings, turbine airfoils, optical windows and lenses, and gears. The invention also can be used to form superlattice composite coatings on single crystal substrates, such as single crystal gas turbine engine airfoils, and non-crystalline (i.e. amorphous) substrates, such as rapidly solidified amorphous glass, metals and alloys, to provide a high hardness coating thereon. Thus, although the invention is illustrated herebelow in the Examples with respect to coating a M-2 tool steel substrate with a superlattice composite coating, it is not intended to be limited to this substrate material.

Moreover, the invention is not limited to the particular ion bombarded, polycrystalline ceramic/ceramic and metal/ceramic multi-layers described herebelow but rather can comprise multi-layers of various materials including metals, alloys, ceramics, and carbon such as diamond in appropriate numbers and sequences to obtain polycrystalline superlattice coatings having desired hardness properties. Ceramic layers can be selected from the group consisting essentially of a nitride layer, carbide layer, oxide layer, boride layer and combinations thereof such as a carbonitride layer, oxynitride layer, and the like. The particular TiN/NbN, TiN/Ni, and NiCr/TiN superlattice composite coatings described herebelow in the Examples thus are offered for purposes of illustration and not limitation.

The deposited layers are considered to constitute "superlattice" layers when the layers have sufficiently thin individual layer thicknesses and sufficiently distinct and different compositions at their interfaces as to collectively exhibit a hardness greater than any individual layer material in homogenous or bulk form at a comparable thickness. The superlattice layers formed on the substrate typically have individual layer thicknesses not exceeding about 150 nanometers in order for the layers to provide a collective hardness greater (e.g. at least 2-3 times greater) than that of any layer material in homogenous or bulk form of comparable thickness.

In a preferred embodiment of the invention, the individual superlattice layer thickness is at least about 1 nm and does not exceed about 75 nm (nanometers) to this end. Even more preferably, the individual superlattice layer thickness is maintained at least about 1.5 nm and does not exceed about 10 nm. The individual layer thicknesses employed will vary with the compositions of the superlattice layers used, the number of superlattice layers used in the lamellar coating structure, the composition of the substrate used, and the coating hardness needed for a particular service application. Different individual layer thickness can be employed in the composite coating. The overall or total thickness of the composite coating formed by the superlattice layers is generally about 0.05 to 20 microns.

With respect to reactive sputter deposition of the composite coatings, the invention involves controlling several key coating parameters in order to deposit a plurality of ion bombarded, polycrystalline superlattice layers effective collectively exhibit substantially improved (i.e. at least 2-3 times greater) hardness on the substrate surface. The controlled parameters include individual superlattice layer thickness discussed here-above. The controlled parameters also include the reactive gas partial pressure that affects the composition of the superlattice layers formed and the ratio of reactive gas partial pressures at multiple targets, if used, that also affects the compositions of superlattice layer formed in front of each target. Since the compositions of the superlattice layers affect the collective coating hardness achievable, the layer compositions can be controlled by partial pressure control to maximize collective composite coating hardness. The substrate ion current density and substrate bias voltage during deposition are controlled parameters that are selected to produce polycrystalline superlattice layers that are substantially free of intergranular voids as a result ion bombardment densification. The invention involves the recognition that polycrystalline superlattice layers can be ion bombarded during deposition on the substrate to an extent that they are substantially free of intergranular voids and that this coating densification can be achieved without compositonal intermixing of the layers to a substantial extent that detracts from the collective hardness achievable.

The invention further involves the recognition that the interfaces between the ion bombarded, polycrystalline superlattice layers can be planar or non-planar and still achieve the objects of the invention. In particular, as the Examples below will illustrate, the invention recognizes that the configuration of interfaces between the polycrystalline superlattice layers can be highly non-planar, such as extremely bowed, and still achieve improved composite coating hardness. Moreover, the Examples will illustrate that the interfaces, although planar, can exhibit substantial interlayer roughness (lack of sharp interlayer interfaces) resulting from some layer intermixing during deposition and still achieve the desired high hardness. Thus, high hardness superlattice composite coatings can be formed on various substrates, including polycrystalline substrates, without the need to achieve a particular highly parallel, sharp interlayer interface configuration. Thus, coating parameters can be chosen to maximize deposition rate where possible to facilitate commercial production of coated substrates of all kinds.

The invention also involves vapor depositing the ion bombarded, polycrystalline superlattice layers under conditions, especially substrate temperature, that are effective to permit retention of beneficial substrate mechanical properties. For example, the superlattice layers can be deposited at temperatures where heat treated (e.g. tempered or precipitation hardened) steel substrates substantially retain their heat treated properties. In particular, steel substrates can be coated with the ion bombarded, polycrystalline superlattice layers at temperatures of 200°-400° C. where the heat treated condition of the steel is not adversely affected. Moreover, preferred steel microstructures, such as hard, quenched martensitic microstructures, can be retained at the low temperatures involved in depositing the polycrystalline superlattice layers on the substrate.

The high vacuum condition (e.g. coating chamber base pressure of $1 \times 10^{-6}$ Torr) before deposition of the ion bombarded, polycrystalline superlattice layers is advantageous in preventing unwanted reaction of the substrate with tramp elements that could adversely affect substrate properties during substrate cleaning. Moreover, contamination of the superlattice layer compositions with tramp elements during coating deposition is avoided by the vacuum conditions used during coating.

The following Examples are offered for purposes of illustrating, not limiting, practice of the present invention to produce substrates having a composite superlattice coating thereon of high hardness.

EXAMPLE I

Polycrystalline M-2 tool steel substrates, each 2.5 cm×2 cm×0.6 cm, were individually coated with a plurality of ion bombarded, polycrystalline superlattice TiN/NbN layers in the apparatus described in detail hereabove and shown in FIGS. 1-5. Each substrate was individually coated in the apparatus. Each polycrystalline M-2 steel substrate was polished and solvent-cleaned prior to being placed in the coating chamber 12. After positioning in the coating chamber 12, each substrate was sputter etched (cleaned) in the coating chamber for 15 minutes at an Ar pressure of $2.5 \times 10^{-2}$ Torr and substrate etching voltage of -850 V DC.

In order to determine coating conditions where high rate deposition of TiN and NbN occur, the complete hysterisis curves of $N_2$ partial pressure versus $N_2$ flow rate at 5 kW power applied on each target 21, 21' were determined. Under $N_2$ flow control mode, the $N_2$ was added to the system in 0.5 sccm (standard cubic centimeter per minute) increments. After the targets were totally nitrided at a high $N_2$ flow rate value, the flow rate was reduced by decreasing the $N_2$ flow rate in 0.5 sccm increments down to zero. The $N_2$ partial pressure at each flow rate increment was recorded by the mass spectrometer 60. Measurements were made with a single Ti target, a single Nb target, and both a Ti target (target 21 of FIG. 1) and Nb target (target 21' of FIG. 1). The curves generated are shown in FIG. 6. The hysterisis curves were generated and analyzed in accordance with the principles of aforementioned U.S. Pat. No. 4,428,811 and Thin Solid Films, 171, 171 (1990), the teachings of both of which are incorporated herein by reference.

It is apparent that the knee (point B) for the Nb target is larger than the knee (point A) for the Ti target such that a higher $PN_2$ is required to form stoichiometric NbN than to form stoichiometric TiN. The sputter yield of Nb is greater than that for Ti such that Nb needs more $N_2$ than Ti at the same target power level to form the stoichiometric nitride compound. Thus, the Ti and Nb targets 21, 21' of FIG. 1 require different $N_2$ partial pressures and flows of $N_2$ to form the stoichiometric compounds, TiN and NbN, respectively, when Ti and Nb are sputtered simultaneously. The deposition parameters corresponding to point C (knee) of the Ti and Nb curve were employed to achieve deposition of the superlattice layers on each etched substrate.

In particular, unless otherwise specified, coating of each M-2 steel substrate was conducted under a total gas pressure (PAr+$N_2$) of $8 \times 10^{-3}$ Torr maintained by the pressure sensor 50 and Ar flow controller 52 of FIG. 1. This total gas pressure was established after the chamber 12 had been evacuated to $1 \times 10^{-6}$ Torr. Evacuation is continued during coating deposition through throttled pumps. A total partial nitrogen pressure ($PN_2$) of $2 \times 10^{-4}$ Torr was maintained by the mass spectrometer 60 and master control means 64 of FIG. 1. The $N_2$ partial pressure between the Nb target and the Ti target was maintained at a 2:1 ratio during sputtering by the mass spectrometer 60, master control means 64, and slave control means 66, 68. The nitrogen gas used was ultrahigh purity (i.e. greater than 99.999%).

A constant negatively applied substrate bias voltage, Vs, of a value in the range of 40–200 V DC was used, except when the substrate was unbiased (i.e. at floating potential of plasma measured to be −34 V). During deposition, a constant target power of 5 kW was used for the Ti target (purity greater than 99.9%) and the Nb target (purity greater than 99.9%). Deposition time was 60 minutes.

The superlattice period, $\Lambda$, was controlled by controlling the rotational speed of the substrate holder 32 so as to alternately expose each substrate to the Ti 30 target and the Nb target during deposition. The superlattice period, $\Lambda$, equals the sum of the thicknesses of the TiN/NbN bi-layer that is repeated throughout the overall composite coating thickness. For the TiN/NbN bi-layer, $$1\frac{\tau_{iN}}{\Lambda} = 0.4 \text{ and } 1\frac{_{NbN}}{\Lambda} = 0.6.$$

Superlattice $\Lambda$ values were determined from the substrate rotation speed and measured deposition rates. Overall coating thickness was measured using a CSEM Calotester.

Figure 7:
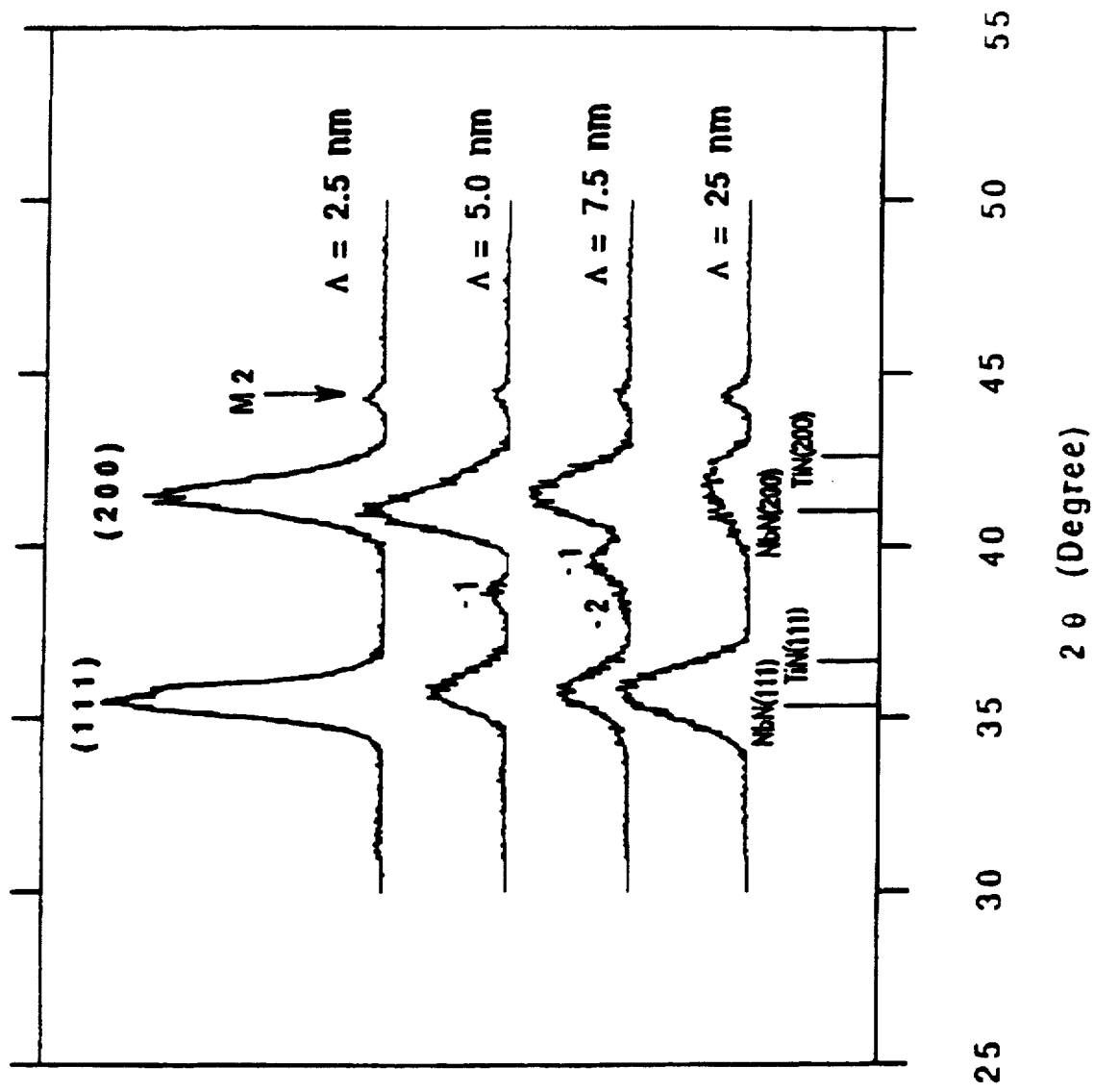
FIG. 7 includes X-ray diffraction patterns for TiN/NbN superlattice layers formed with $\Lambda$ of 2.5, 5, 7.5, and 25 nm at $PAr+N_2=8\times10^{-3}$ Torr, $PN_2=2\times10^{-4}$ Torr, and substrate bias voltage=−150 V.

FIG. 7 illustrates X-ray diffraction patterns for a series of ion bombarded, polycrystalline TiN/NbN superlattice layers grown one atop the other in alternating lamellar sequence on M-2 tool steel substrates for 60 minutes under the deposition conditions set forth hereabove (substrate bias=−150 V.) but at different substrate holder rotational speeds. Thus, the TiN/NbN superlattice layers had different superlattice periods, $\Lambda$. The total composite coating thickness for each substrate was on average about 5–6 micrometers. The diffraction patterns were obtained using a Scintag XDS 2000 PAD V diffractometer with Cu K$\alpha$ radiation and at an operating voltage was 45 kV with tube current of 40 mA.

The X-ray diffraction spectra from the polycrystalline superlattice TiN/NbN layers were similar to those for pure TiN and NbN. The most intense diffraction peaks correspond to the average interplanar spacing of (Ti, Nb) N alloy (111) and (200) planes. The first order (200) negative satellite peak is present in the coatings formed with the period $\Lambda$=5.0 and 7.5 nm. No satellite peaks are present for the coating grown with $\Lambda$=2.5 nm. Increasing $\Lambda$ to 25 nm yielded a transition from main peaks with well resolved satellite peaks to broad peaks consisting of closely spaced and unresolved satellite peaks at d-spacings ranging from TiN to NbN. The cubic phase (111) and (200) peak positions of TiN and NbN are plotted in the lower part of FIG. 7 for comparison purposes. The absence of higher order satellite peaks is due to the roughness of the interfaces between the TiN and NbN layers. In contrast to the spectra shown in FIG. 7, single crystal TiN/NbN superlattice coatings with interface sharpness of±1 monolayer show satellite peaks up to the 9th order.

Figure 8:
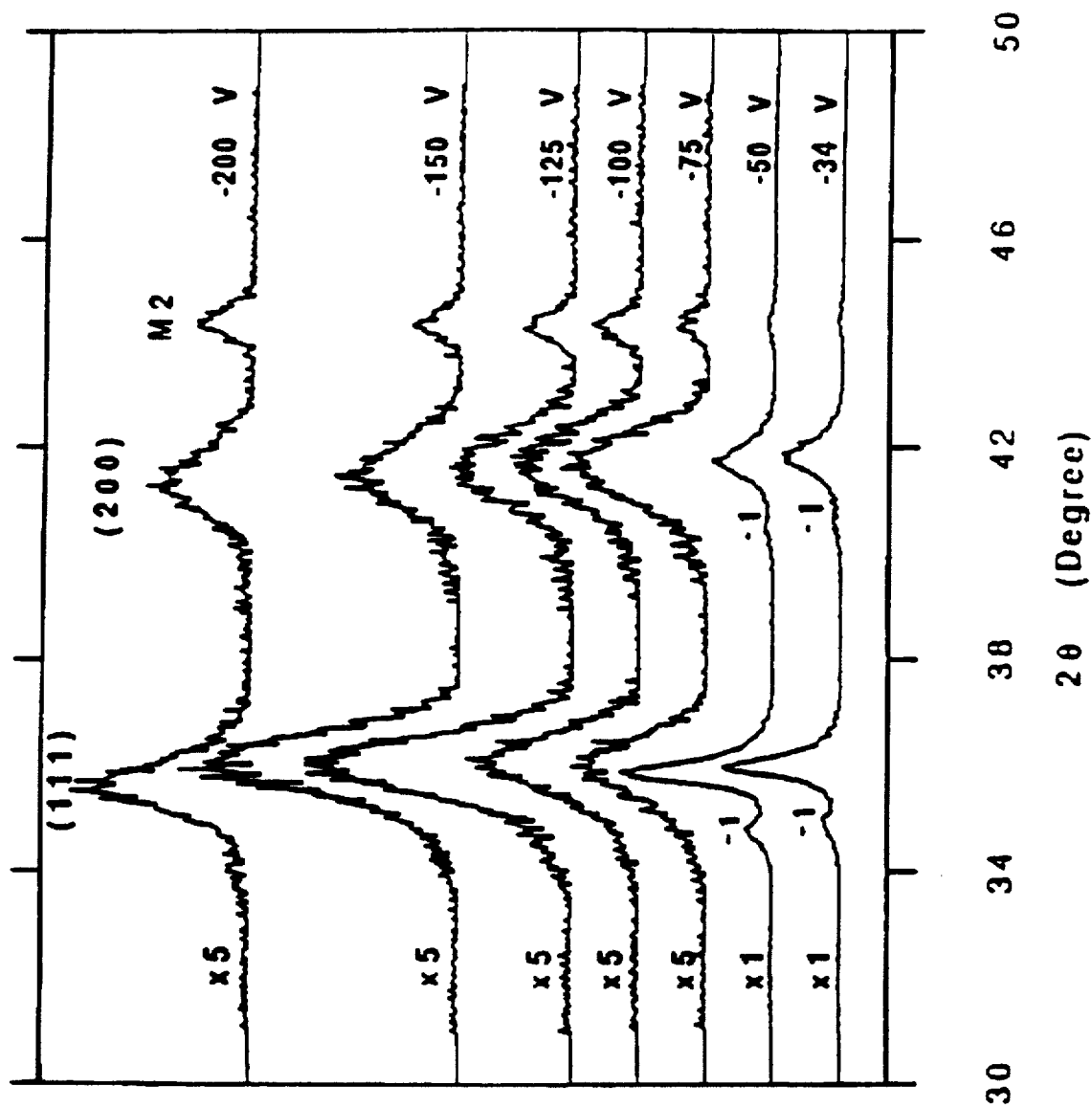
FIG. 8 includes X-ray diffraction patterns for TiN/NbN superlattice layers ($\Lambda=8$ nm) formed with 20 negative substrate bias voltages of 34 (floating), 50, 75, 100, 150, and 200 V at $PAr+N_2=8\times10^{-3}$ Torr and $PN_2=2\times10^{-4}$ Torr.

FIG. 8 illustrates X-ray diffraction patterns for the TiN/NbN coatings formed under the same conditions as described hereabove except that substrate voltage was controlled from −34 to −200 V and $\Lambda$ was 8 nm. For the coatings deposited with substrate voltages of −34 and −50 V, the full width at half maximum (FWHM) is 0.2 degrees, and the (111) peaks are stronger than the (200) peaks. First order negative satellite peaks of both (111) and (200) and main peaks were clearly present, the satellite peak positions agreeing well with the expected $\Lambda$ value. As substrate voltage was increased to −75 V and higher, the FWHM increased to 1.0 degree, and the intensity decreased.

Figure 9:
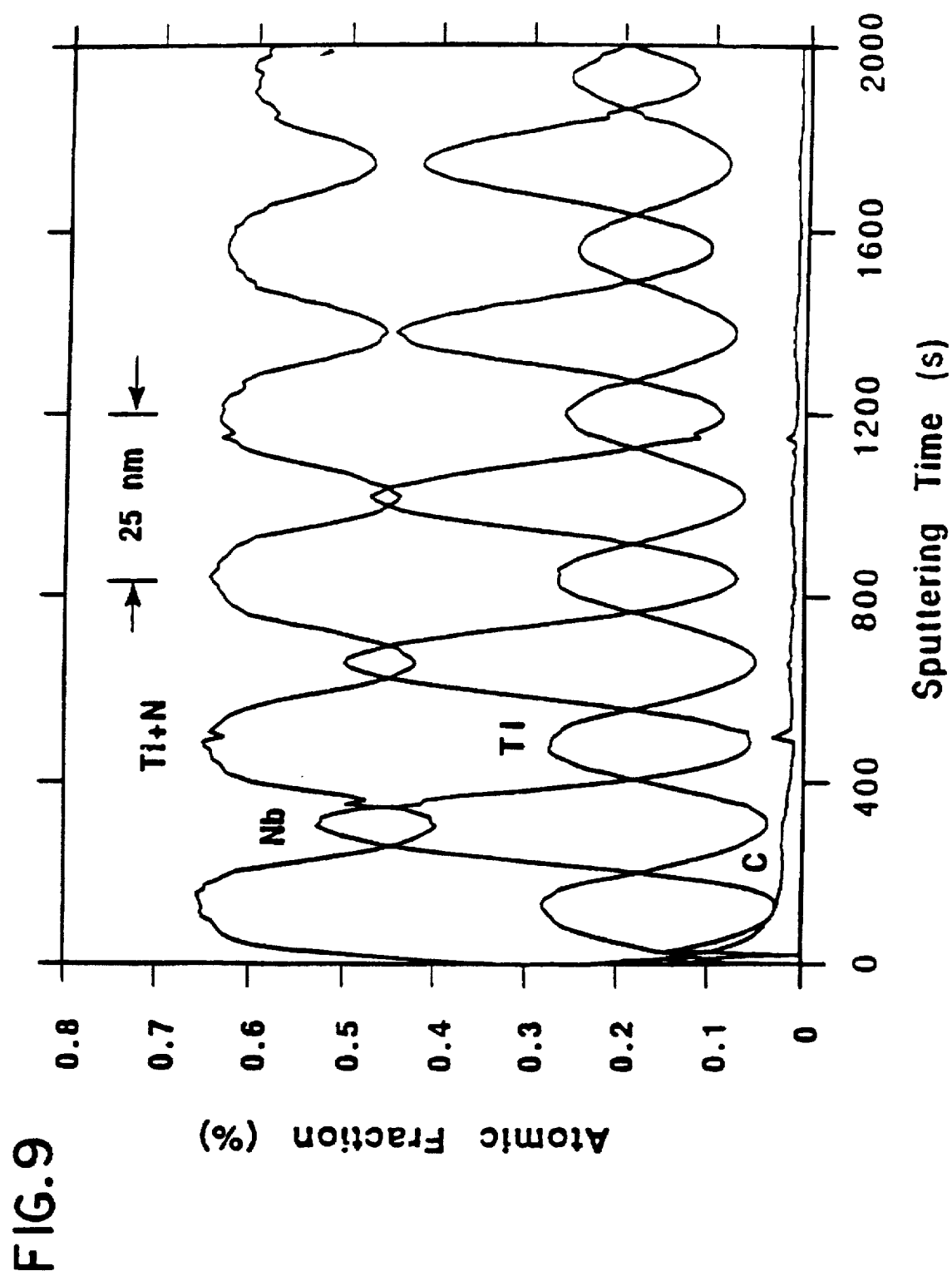
FIG. 9 is an AES depth profile showing the chemical composition of a TiN/NbN superlattice layer with $\Lambda=25$ nm formed at $PAr+N_2=8\times10^{-3}$ Torr, $PN_2=2\times10^{-4}$ Torr, and substrate bias voltage=−150 V

FIG. 9 illustrates semi-quantitative Auger electron spectroscopy (AES) profiles for Ti, Nb, N, and C concentrations during sputter etching of an ion bombarded, polycrystalline superlattice TiN/NbN coating having a $\Lambda$ of 25 nm deposited at a substrate voltage of −150 V. A strong Ti and Nb composition modulation is clearly present in the composite coating. The same strong composition modulation was observed in other composite TiN/NbN superlattice coatings made in accordance with the invention. AES measurements were obtained using a Perkin-Elmer 455 Auger microprobe. The energy of the electron beam during the measurement was 3 keV at a beam current of 16 microA. Semi-quantitative analysis was conducted using tabulated elemental sensitivity factors.

Figure 10:
FIG. 10 is a bright field transmission electron micrograph of a cross-section of a TiN/NbN composite coating with $\Lambda=25$ nm formed at $PAr+N_2=8\times10^{-3}$ Torr, $PN_2=2\times10^{-4}$ Torr, and substrate bias voltage =−150 V showing generally planar but rough interfaces between the layers.

FIG. 10 is a bright field X-ray transmission electron micrograph of a composite coating with a superlattice layer $\Lambda$=25 nm deposited at a substrate voltage of −150 V. The micrograph illustrates alternating layers of TiN and NbN to form a lamellar composite coating. The superlattice layers are generally planar and parallel but have relatively rough (i.e. 2–3 nm of roughness) interfaces; i.e. the interfaces lack the sharpness of epitaxially grown layers where roughness at the interface is less than±1 monolayer. The region shown in the micrograph is near the substrate interface, but the appearance of this region is representative of the entire composite coating. The lighter layers are TiN and the darker layers are NbN. An intermediate Ti layer shown in the micrograph as a white band was deposited on the substrate prior to deposition of the polycrystalline superlattice coating. The pronounced contrast differences between superlattice layers indicate the presence of strong composition modulation near the layer-substrate interface in agreement with the AES profile shown FIG. 8. Based on these results, bulk thermal diffusion or ion-induced intermixing between the layers appeared to be minor in the composite coating of $\Lambda$=25 nm. The micrograph of FIG. 10 was made using a Hitachi-700 transmission electron microscope (TEM) operated at 200 kV.

Figure 11:
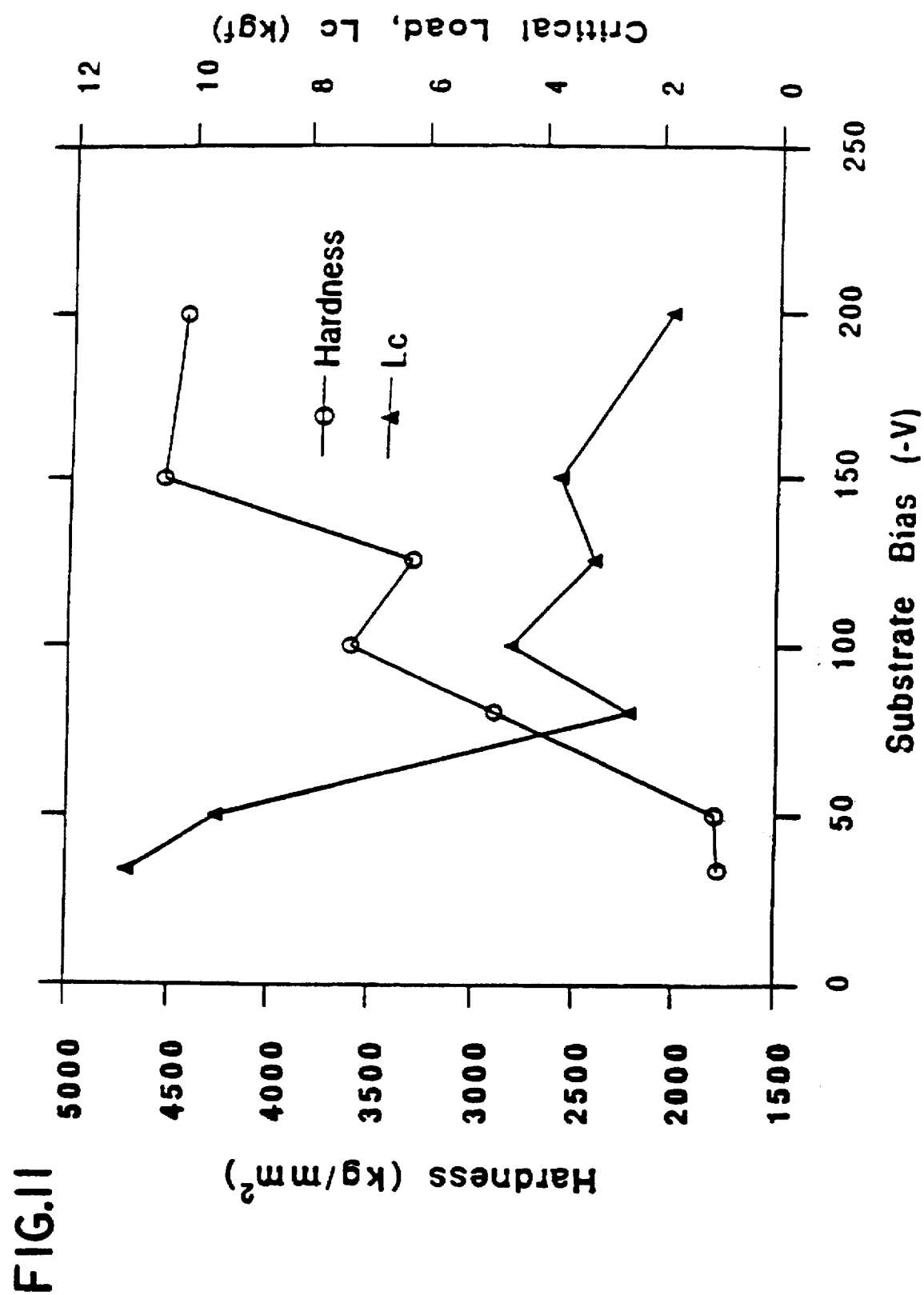
FIG. 11 is a graph of Vickers microhardness and scratch adhesion critical load for TiN/NbN superlattice coatings ($\Lambda=8$ nm) versus substrate bias voltage formed at $PAr+N_2=8\times10^{-3}$ Torr and $PN_2=2\times10^{-4}$ Torr.

FIG. 11 illustrates the Vickers microhardness (Hv) and scratch test critical load (Lc) for adhesion of TiN/NbN superlattice composite coatings deposited under the conditions set forth hereabove but using different substrate voltages with PN$_2$=2×10$^{-4}$ Torr and $\Lambda$=7.6±1.0 nm. The overall composite coating thickness was 514 6 microns after a 60 minute deposition time.

The Vickers microhardness (Hv) of the composite coatings was measured using a Leco DM-400FT microhardness tester with flat-field optics and a maximum of 1000X magnification. All microhardness indentations were made for 15 seconds at a load of 50 gf. The measured standard deviation for all reported hardness values was less than±10%. The scratch test critical load were made using a CSEM manual scratch tester at intervals of 0.1 kgf.

The microhardness values increased as the negative substrate voltage, Vs, increased. A coating microhardness above 4500 kg/mm$^2$ was obtained at a substrate voltage of −135 V. The scratch test critical load decreases as negative substrate voltage was decreased. The critical load value is highest at 11 kgf at a substrate voltage of −34 V but decreased to 1.8 kgf as substrate voltage increased to −200 V.

Figure 12:
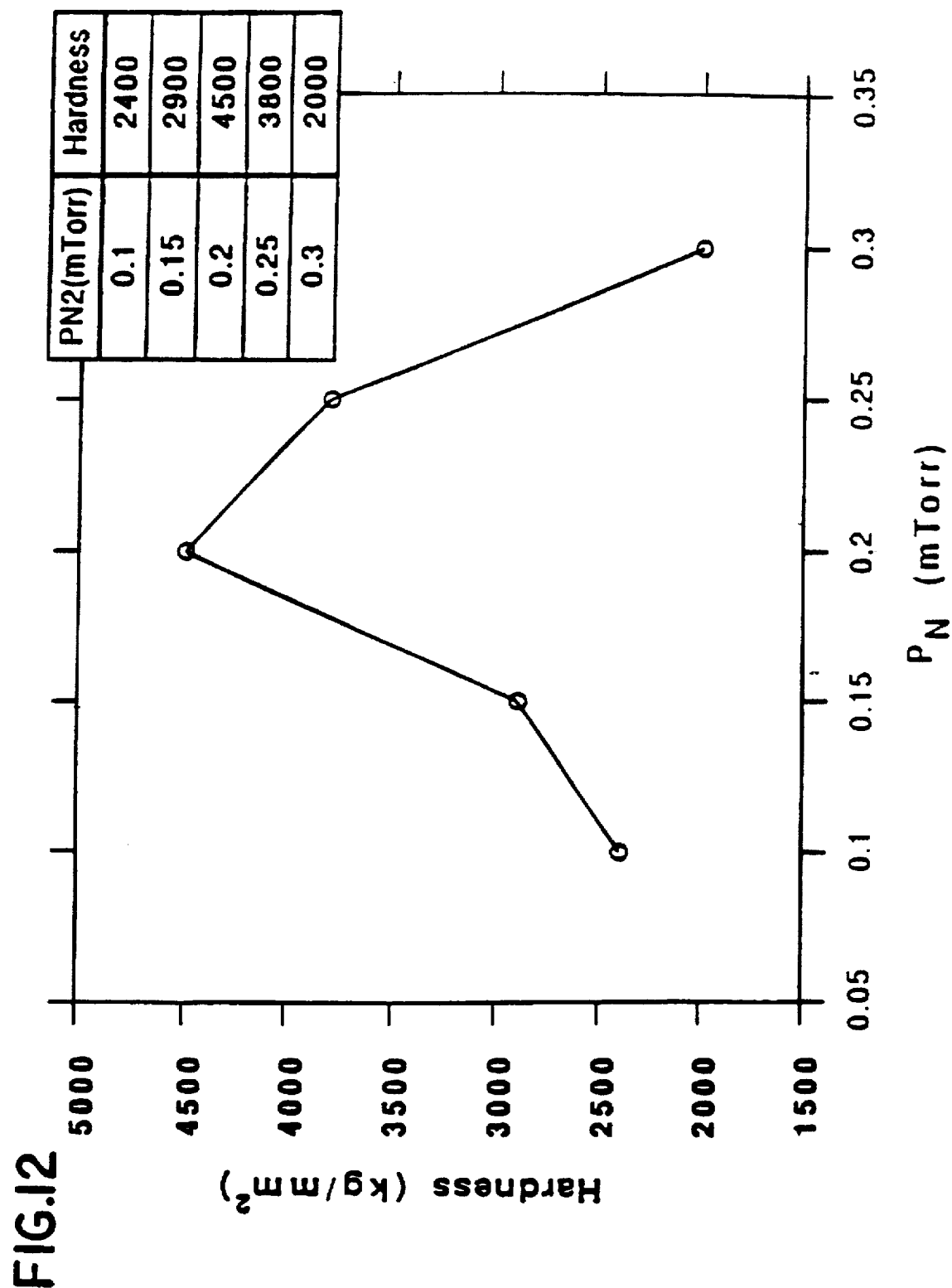
FIG. 12 is a graph of Vickers microhardness for TiN/NbN superlattice coatings ($\Lambda 8$ nm) as a function of $N_2$ partial pressure at $PAr+N_2=8\times10^{-3}$ Torr and substrate bias voltage =−150 V.

FIG. 12 illustrates the Vickers microhardness (Hv) for TiN/NbN superlattice composite coatings deposited under the conditions set forth hereabove but using different N$_2$ partial pressures with Vs=−150 V and $\Lambda$=8 nm. The overall composite coating thickness was 5–6 microns after a 60 minute deposition time. A peak hardness of 4500 kg/mm$^2$ was obtained at PN$_2$=2×10$^{-4}$ Torr.

Figure 13:
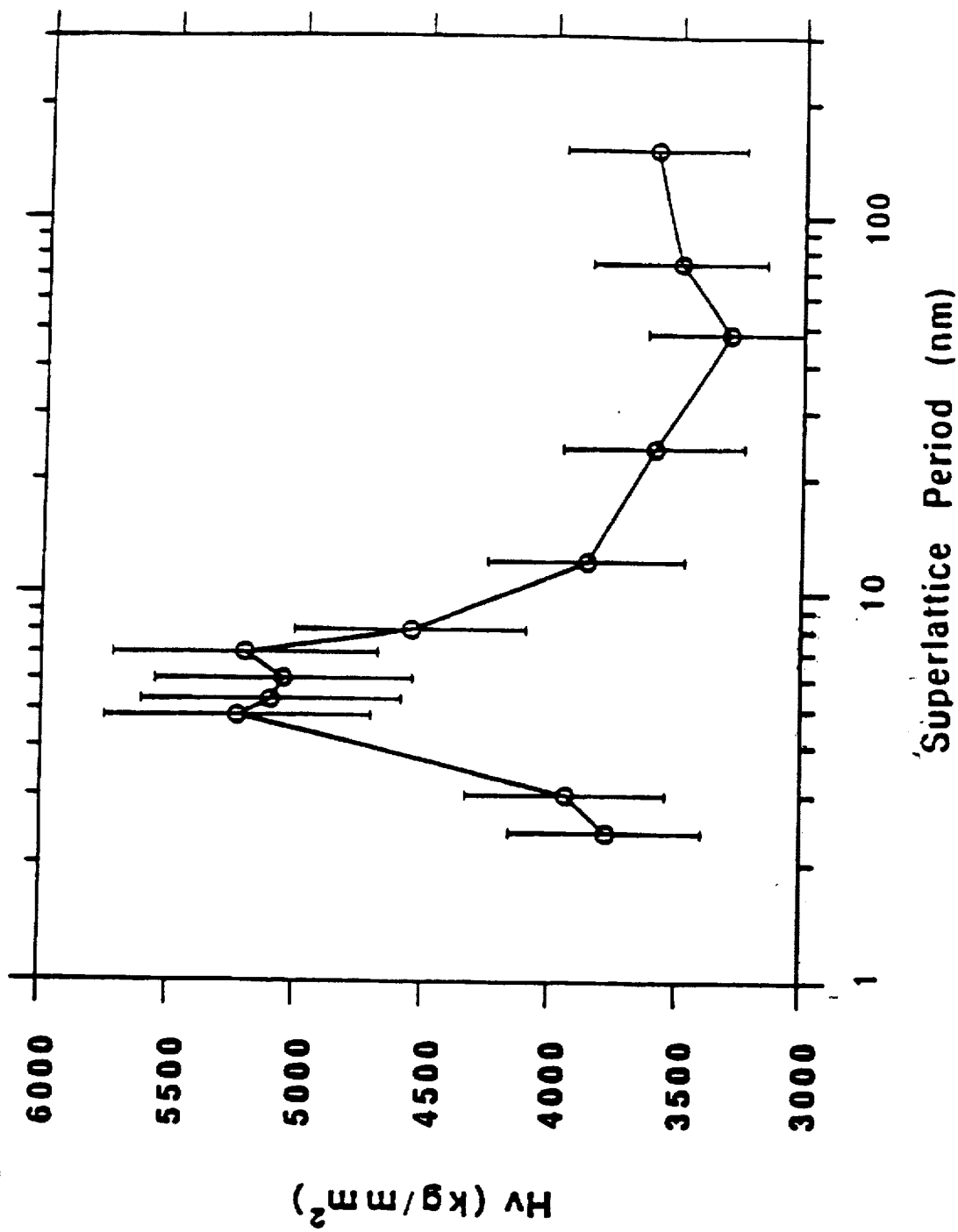
FIG. 13 is a graph of Vickers microhardness for TiN/NbN superlattice coatings as a function of superlattice period at PAr+N$_2$=8×10$^{-3}$ Torr, PN$_2$=2×10$^{-4}$ Torr, and substrate bias voltage=−150 V.

The variation of microhardness, Hv, of a TiN/NbN superlattice composite coating as a function of superlattice period $\Lambda$ is shown in FIG. 13. Hv increased rapidly with increasing A. A maximum value above 5000 kg/mm$^2$ (e.g. about 5200 kg/mm$^2$) was reached at Λ=5–8 nm (i.e. at Λ less than 10 nm where the TiN layer thickness is 4 nm and the NbN layer thickness is 6 nm). Thereafter, Hv decreased with increasing Λ. Scratch test critical load measurements produced values of Lc=3.3 plus or minus 0.3 kgf regardless of the superlattice period.

This Example demonstrates that high hardness, 30 adherent composite coatings comprising a plurality of vapor deposited, ion bombarded, dense, polycrystalline TiN/NbN superlattice layers can be grown one atop the other on polycrystalline M-2 tool steel substrates in accordance with the present invention. The results indicate a strong peak coating hardness as a function of PN$_2$ corresponding to both stoichiometric TiN and NbN achievable by independently controlling N$_2$ partial pressure at the Ti and Nb targets 21, 21' of FIG. 1 in the manner described hereabove. Ion bombardment during bias sputter deposition significantly beneficially affects the coating hardness achievable by appearing to decrease porosity in the layers, especially intergranular voids in the layers. Moreover, hardness of the composite coating can be optimized by proper selection of the superlattice period, Λ, or in other words the individual superlattice layer thicknesses. The ion bombarded, polycrystalline superlattice layers of the invention can be formed on polycrystalline substrates to exhibit coating hardness values about 2000 kg/mm$^2$ greater than the hardness values for homogenous or bulk polycrystalline TiN layers (2000–3000 kg/mm$^2$) and NbN layers (2250–3200 kg/mm$^2$) of comparable overall coating thickness deposited under similar conditions.

The observed roughness at the planar interlayer interfaces did not limit the high coating hardness values achievable.

Furthermore, the temperature of the substrate after coating was determined to be in the range of 100 to 400° C. This temperature was attributable to interaction of the substrate with the plasma since the substrate was not intentionally heated. Importantly, the substrate temperature was maintained low enough that the mechanical properties of the M-2 tool steel substrate would not be adversely affected by the coating operation. This allows tool steels and other common engineering materials to be coated with high hardness composite coating of the invention and yet retain the desirable properties of the substrate material.

EXAMPLE II

Polycrystalline M-2 steel substrates were individually coated with a plurality of ion bombarded, polycrystalline superlattice TiN/NbN layers in the apparatus described in detail hereabove and shown in FIGS. 1–5. Each polycrystalline M-2 steel substrate was polished and solvent-cleaned prior to being placed in the coating chamber 12. After positioning in the chamber 12 and after chamber pressure reached 2×10$^{-6}$ Torr, each substrate was sputter etched (cleaned) in the chamber 12 for 10 minutes at an Ar pressure of 3.0×10$^{-2}$ Torr and substrate etching voltage of –850 V DC.

Coating of each M-2 steel substrate was conducted under a total gas pressure (PAr+N$_2$) of 8×10$^{-3}$ Torr. A total partial nitrogen pressure (PN$_2$) of 2×10$^{-4}$ Torr was maintained. The N$_2$ partial pressure between the Nb and Ti targets was maintained at a 2:1 ratio during sputtering by the aforementioned mass spectrometer 60, master control means 64, and slave control means 66, 68. The target and substrate voltage levels as well as deposition time were the same as in Example I.

The period, Λ, of the superlattice bi-layers deposited on each substrate was controlled by controlling the rotational speed of the substrate holder 32.

Table 1 below sets forth parameters used to produce ion bombarded, polycrystalline TiN/NbN superlattice layers in lamellar manner on polycrystalline M-2 steel substrates and the coating hardness achieved using these parameters.

TABLE 1

| | N$_2$ flow ratio for Nb:Ti = 2:1 | | | |
|---|---|---|---|---|
| Bias Voltage (V) | Ion Current Density (mA/cm$^2$) | P$_{N_2}$ (10$^{-4}$ Torr) | Period Λ (nm) | Hardness ± 10% (kg/mm$^2$) |
| –150 | 4.2 | 2 | 5 | 4700 |
| –80 | 4.2 | 2 | 8 | 3900 |
| –150 | 4.2 | 2 | 8 | 5200 |
| –150 | 4.2 | 2 | 24 | 4900 |

Figure 14:
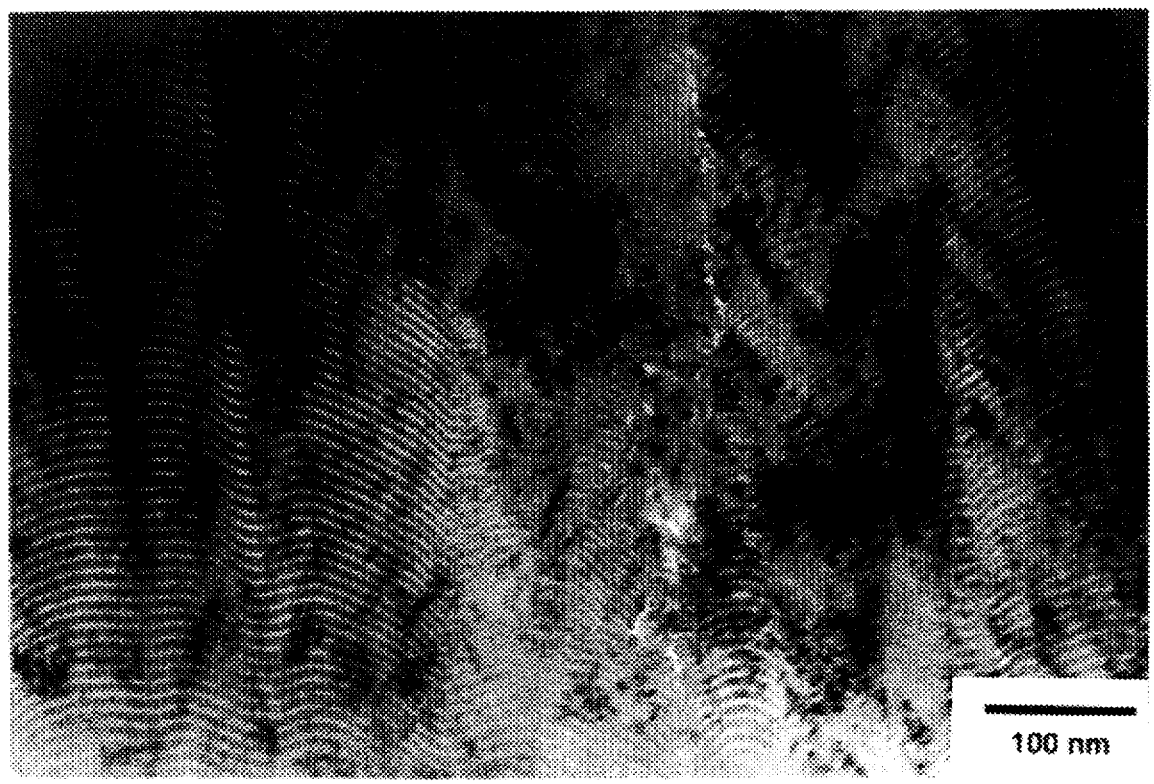
FIG. 14 is a bright field transmission electron micrograph of a cross-section of a TiN/NbN composite coating with Λ=7.5 nm formed at PAr+N$_2$=8×10$^{-3}$ Torr, PN$_2$=2×10$^{-4}$ Torr, and substrate bias voltage=−80 V showing non-planar (e.g. bowed) interfaces between the layers.

Table 1 demonstrates that high hardness, adherent composite coatings comprising a plurality of ion bombarded, dense, polycrystalline TiN/NbN superlattice layers can be grown one atop the other on polycrystalline M-2 tool steel substrates in accordance with the present invention. FIG. 14 is a bright field X-ray transmission electron micrograph of the polycrystalline superlattice coating (overall thickness =5.8 microns) deposited at –80 V substrate bias in Table 1. The micrograph illustrates alternating bi-layers of TiN and NbN (average bi-layer thickness of 7.4±0.9 nm) that are highly non-planar; i.e. the superlattice layers bow outwardly near the centers of their columnar grains. The coating yielding the maximum coating hardness of 5200 kg/mm, (comparable to the hardness achieved in Example I where planar interfaces were present between the superlattice layers) was not metallographically examined but would be expected to have non-planar (bowed) interlayer interfaces. In FIG. 14, the lighter layers are TiN and the darker layers are NbN. The pronounced contrast differences between layers indicate the presence of strong composition modulation near the layer-substrate interface.

EXAMPLE III

Additional polycrystalline M-2 steel substrates were individually coated with a plurality of polycrystalline superlattice TiN/NbN layers using apparatus like that of FIG. 1 with the exception that a smaller diameter (e.g. 7.6 cm) substrate holder 32 was used in combination with an electrically floating, stainless steel baffle (not shown) that extended laterally between and parallel to the targets in a plane containing the diameter of the substrate holder.

Table 2 below sets forth parameters used to produce ion bombarded, polycrystalline TiN/NbN superlattice layers on polycrystalline M-2 steel substrates and the coating hardness achieved using these parameters for similar deposition times.

TABLE 2

| Bias Voltage (V) | Ion Current Density (mA/cm$^2$) | PN$_2$ (10$^{-4}$ Torr) | Period Λ (nm) | Hardness ± 10% (kg/mm$^2$) |
|---|---|---|---|---|
| | Baffled chamber with N$_2$ flow ratio for Nb:Ti = 1:1 | | | |
| 0 | 0 | 4 | 7 | 1150 |
| –80 | 1.3 | 4 | 14 | 1550 |
| –150 | 1.8 | 4 | 6 | 2000 |
| –150 | 1.8 | 2 | 6 | 3200 |
| –150 | 1.9 | 1 | 6 | 1750 |

TABLE 2-continued

| Bias Voltage (V) | Ion Current Density (mA/cm$^2$) | PN$_2$ (10$^{-4}$ Torr) | Period Å (nm) | Hardness ± 10% (kg/mm$^2$) |
|---|---|---|---|---|
| -150 | 1.8 | 2 | 4 | 3550 |
| -150 | 1.9 | 2 | 6 | 3650 |
| -150 | 1.8 | 2 | 9 | 3500 |
| -150 | 1.2 | 2 | 14 | 2500 |
| -150 | 1.9 | 2 | 17 | 2650 |
| -150 | 1.9 | 2 | 27 | 2650 |
| -150 | 1.8 | 2 | 55 | 3100 |
| Baffled chamber with N$_2$ flow ratio for Nb:Ti = 2:1 | | | | |
| -150 | 1.8 | 3 | 4 | 2800 |
| -150 | 1.9 | 2 | 4 | 3850 |
| -150 | 1.9 | 2 | 4 | 4050 |
| -150 | 1.9 | 2 | 6 | 3700 |
| -150 | 1.9 | 2 | 8 | 3300 |
| -120 | 1.2 | 2 | 5 | 3300 |
| -80 | 1.9 | 2 | 6 | 2300 |

A comparison of Table 2 of this Example to Table 1 of Example II reveals the importance of establishing high ion current density at the substrate. For example, use of the baffle in this Example was found to produce ion current densities below 2 mA/cm$^2$. The ion current densities are much lower than those produced in Example II. As is apparent, the coating hardnesses produced in the presence of the higher ion current densities of Table 1 in general are considerably higher than the coating hardnesses produced at the lower ion current densities of Table 2. The increase in coating hardness with increasing ion current density and also with substrate electrical bias indicate that ion bombardment densification of the superlattice layers is important in achieving optimum hardness in the composite coating.

EXAMPLE IV

Polycrystalline M-2 steel substrates, each 2.5 cm×2 cm×0.6 cm, were individually coated with a plurality of ion bombarded, polycrystalline superlattice TiN/Ni layers in the apparatus described in detail hereabove and shown in FIGS. 1–5. The TiN layer was deposited first on the substrate followed by deposition of the Ni layer on the TiN layer and so on to form a composite coating. Each substrate was individually coated in the apparatus. Each polycrystalline M-2 steel substrate was polished and solvent-cleaned prior to being placed in the coating chamber 12. After positioning in the chamber 12, each substrate was sputter etched (cleaned) in the chamber 12 for 10 minutes at an Ar pressure of 3×10$^{-2}$ Torr and substrate etching voltage of -850 V DC.

Coating of each M-2 steel substrate was conducted under a total gas pressure (PAr+N$_2$) of 8×10$^{-3}$ Torr maintained by the pressure sensor 50 and Ar flow controller 52 of FIG. 1. A target power of 5 kW was used for the Ti target and 0.5 kW was used for the Ni target. A partial nitrogen pressure (PN$_2$) of 1.2×10$^{-4}$ Torr or 1.5×10$^{-4}$ Torr was maintained proximate the Ti target by the mass spectrometer 60, master control means 64, and slave control means 66, 68 of FIG. 1. No N$_2$ flow was provided proximate the Ni target during sputtering. A constant negatively applied substrate bias voltage, Vs, was used. Deposition time was 60 minutes.

The period, Λ, of the superlattice layers deposited on each substrate again was controlled by controlling the rotational speed of the substrate holder 32 (table speed).

Table 3 below sets forth the parameters used to produce ion bombarded, polycrystalline TiN/Ni superlattice layers on polycrystalline M-2 steel substrates and the coating hardness achieved using these parameters.

TABLE 3

| ID | Film | Thickness μm | Hv ± 10% kg/mm$^2$ | Lc kg | Period Å | Hv Nano kg/mm$^2$ | Power Ti/Ni kW | I A | Bias -v | Table Speed RPM | P$_{N_2}$ m Torr | Total P m Torr | Comments |
|---|---|---|---|---|---|---|---|---|---|---|---|---|---|
| 1 | TiN | 2.5 | 1450 | | | 2457 | 5 | 3.6 | 100 | 0 | 0.12 | 8 | stationary run |
| 1A | Ni | 2.4 | 760 | | | 791 | 0.5 | | 100 | | | | stationary run |
| 2 | SL | 0.8 | 1100 | 9 | 35 | | 5/.5 | 3.8 | 100 | 10 | 0.12 | 8 | |
| 3 | SL | 3.3 | 660 | | 38 | | 5/.5 | 1.7 | 100 | 10 | 0.12 | 8 | |
| 4 | SL | | 720 | | | | 5/5 | 1.8 | 150 | 10 | 0.12 | 8 | change magnets |
| 5 | SL | 5.2 | 620 | | | | 5/5 | 1.8 | 150 | 10 | 0.12 | 8 | |
| 6 | SL | 4.5 | 680 | | | | 5/5 | 1.8 | 250 | 10 | 0.12 | 8 | |
| 7 | TiN | 2.6 | 2600 | | | | 5 | 1.1 | 150 | 0 | 0.12 | 8 | stationary run |
| 7A | Ni | 6.8 | 560 | | | | 5 | F | 34 | | | | stationary run |
| 8 | SL | | 680 | | | | 5/5 | 1.8 | 400 | 10 | 0.15 | 8 | |
| 9 | SL | 5.0 | 930 | | | | 5/5 | 3.6 | 150 | 20 | 0.15 | 8 | |
| 10 | SL | 5.0 | 860 | | 62 | 973 | 5/5 | 5.4 | 150 | 20 | 0.15 | 8 | |
| 11 | SL | 3.0 | 740 | 4 | | 931 | 5/2 | 2.8 | 150 | 10 | 0.15 | 8 | |
| 12 | SL | 5.0 | 790 | | 250 | | 5/5 | 5.6 | 150 | 5 | 0.15 | 8 | |
| 13 | SL | 4.9 | 780 | | 620 | | 5/5 | 3.8 | 150 | 2 | 0.15 | 8 | 4.9 |
| 14 | SL | | 920 | 6 | | 1428 | 5/.5 | 3.2 | 150 | 20 | 0.15 | 8 | |
| 15 | SL | 1.4 | 1370 | 6 | 17 | 2443 | 5/.25 | 2.2 | 150 | 20 | 0.15 | 8 | *15 |
| 16 | SL | 1.8 | 2200 | 3 | 18 | | 6/.25 | 3.6 | 150 | 20 | 0.15 | 8 | 60 min. dep., |
| 17 | SL | 2.4 | 1360 | | 20 | 1837 | 6.5/.5 | 2.9 | 150 | 20 | 0.15 | 8 | 60 min. dep. |
| 18 | SL | 2.0 | 2500 | 5 | 17 | 3549 | 6/.25 | F | 150 | 20 | 0.12 | 8 | 60 min. dep. |

F = floating
*15 = 2100 kgf/mm nano-indentation
*16 = 4200 kgf/mm nano-indentation Table 3 demonstrates that high hardness, adherent composite coatings (designated SL in the Table) comprising a plurality of ion bombarded, dense, polycrystalline TiN/Ni superlattice layers can be grown one atop the other in lamellar manner on polycrystalline M-2 tool steel substrates in accordance with the present invention. In particular, sample ID number 16 exhibits a coating hardness, H$_{nano}$, of 4200 kg/mm$^2$. This hardness value compares to a hardness, H$_{nano}$, of 2460 and 2910 kg/mm$^2$ measured for TiN homogenous sample layers ID number 1 and 7, respectively, and hardness, H$_v$, of 790 and 560 measured for homogenous Ni sample layers ID number 1A and 7A, respectively. H$_{nano}$ is nano-indentation hardness measured using a commercially available UMIS-2000 ultramicro-indentation system. This hardness measuring system measures surface mechanical constants by direct measurement of indenter penetration as a function of load, under milligram loads. In particular, this system uses a sharp diamond indentor with a minimum force of 0.1 mN. The force and penetration depth are measured accurately to provide hardness and elastic modulus information for very thin layers or coatings; e.g. for coatings as thin as 0.5 microns. The depth resolution is 1 nm. H$_{nano}$ was used as a measure of hardness in Table 3 for relatively low total composite coating thicknesses on the order of 2 microns since at this coating thickness level, the aforementioned Vickers microhardness, H$_v$, test is affected by (soft) substrate effects in the hardness measurement.

Figure 15:
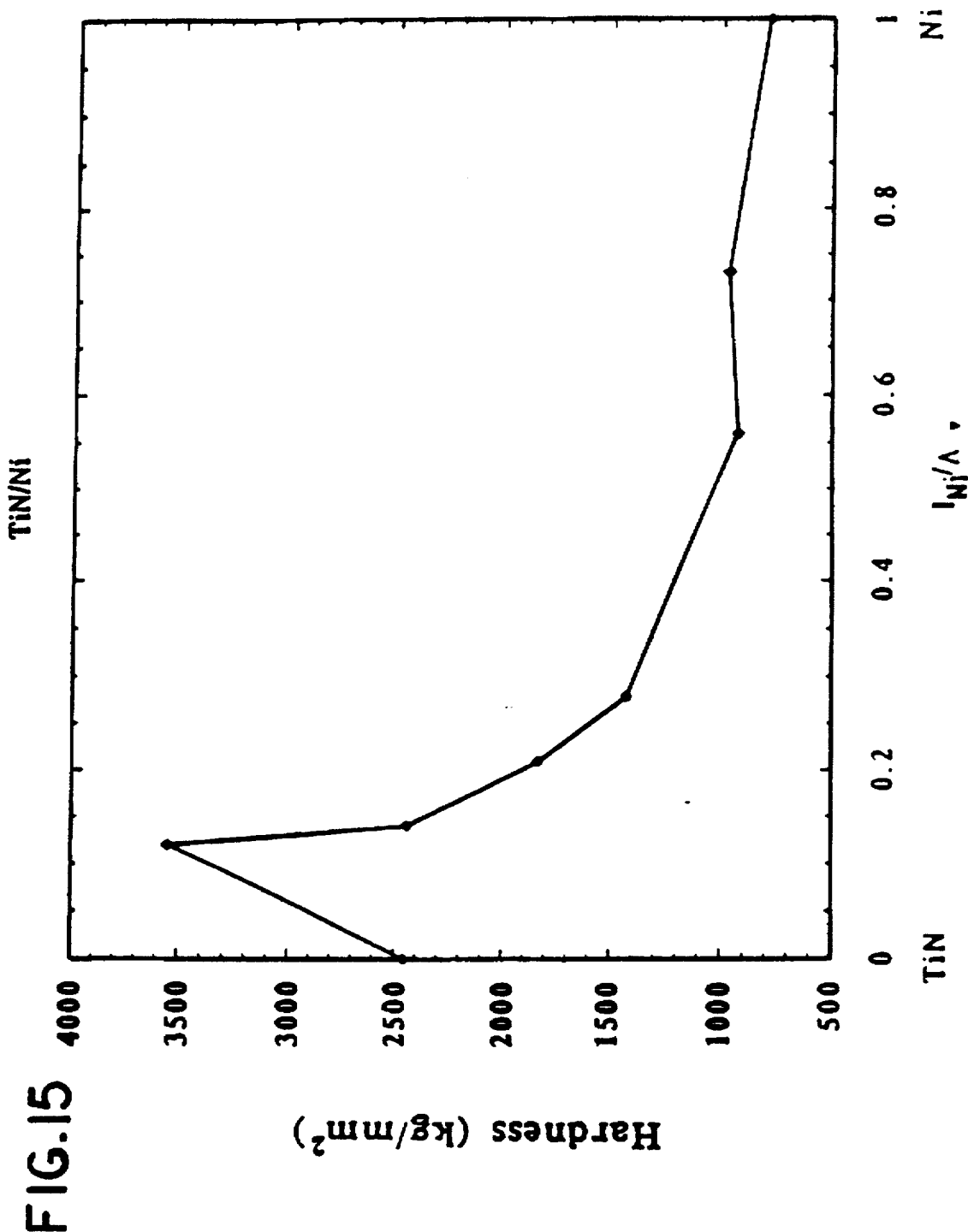
FIG. 15 is a graph of the ratio of Ni layer thickness and of superlattice period versus coating hardness for ion bombarded, polycrystalline TiN/Ni superlattice layers.

The variation of microhardness, Hv, of a TiN/Ni superlattice composite coating as a function of the ratio of Ni layer thickness and superlattice period is shown in FIG. 15. Hv decreased rapidly with decreasing l$_{Ni/\Lambda}$. A scratch test critical load measurement produced a value of Lc=5.0±0.5 kgf as set forth in Table 3.

EXAMPLE V

Polycrystalline M-2 steel substrates, each 2.5 cm×2 cm×0.6 cm, were individually coated with a plurality of ion bombarded, polycrystalline superlattice NiCr/TiN layers in the apparatus described in detail hereabove and shown in FIGS. 1–5. The NiCr alloy layer was deposited first on the substrate followed by deposition of the TiN layer on the NiCr layer and so on to form the composite coating. Each polycrystalline M-2 steel substrate was polished and solvent-cleaned prior to being placed in the coating chamber 12. After positioning in the chamber 12, each substrate was sputter etched (cleaned) in the chamber 12 for 10 minutes at an Ar pressure of 3×10$^{-2}$ Torr and substrate etching voltage of −850 V DC.

Coating of each M-2 steel substrate was conducted under a total gas pressure (PAr+N$_2$) of 8×10$^{-3}$ Torr. A target power of 6 kW was used for the Ti target and 0.21 to 1.0 kW was used for the NiCr target. A partial nitrogen pressure (PN$_2$) of 1.2×10$^{-4}$ Torr was maintained proximate the Ti target. No N$_2$ flow was provided proximate the NiCr alloy target during sputtering. A constant negatively applied substrate bias voltage, Vs, of −150 V DC was used. Deposition time was 60 minutes.

The period, Λ, of the superlattice layers deposited on each substrate was controlled by controlling the rotational speed of the substrate holder 32 (table 30 speed).

Table 4 below sets forth the parameters used to produce ion bombarded, polycrystalline NiCr/TiN superlattice layers on polycrystalline M-2 steel substrates and the coating hardness achieved using these parameters.

TABLE 4

| ID | Film | Thickness μm | H$_{nano}$ ± 10% kg/mm² | Power Ti/Ni kW | I A | Bias −v | Table Speed RPM | P$_{N_2}$ m Torr | Total P m Torr | Comments |
|---|---|---|---|---|---|---|---|---|---|---|
| 1 | SL | | 4270 | 6/0.21 | 4 | 150 | 20 | 0.12 | 8 | |
| 2 | SL | | 3510 | 6/0.25 | 4 | 150 | 20 | 0.12 | 8 | |
| 3 | SL | | 3100 | 6/0.5 | 3 | 150 | 20 | 0.12 | 8 | |
| 4 | SL | | 2880 | 6/1 | 3 | 150 | 20 | 0.12 | 8 | |
| 5 | SL | | 2220 | 6/0.21 | 4 | 150 | 10 | 0.12 | 8 | |
| 6 | SL | | 3520 | 6/0.21 | 4.2 | 150 | 15 | 0.12 | 8 | |
| 7 | SL | | 4000 | 6/0.21 | 4.2 | 150 | 5 | 0.12 | 8 | |
| 8 | SL | | 3840 | 6/0.21 | 4 | 150 | 30 | 0.15 | 8 | |
| 9 | SL | | 4470 | 6/0.21 | 4 | 150 | 30 | 0.15 | 8 | |
| 10 | NiCr | | 1090 | 0.21 | 4.2 | 150 | 0 | 0.15 | 8 | |
|  | TiN | | x | 6 | | | | | | surface rough |

Table 4 demonstrates that high hardness, adherent composite coatings (designated SL in the Table) comprising a plurality of ion bombarded, dense, polycrystalline NiCr/TiN superlattice layers can be grown one atop the other on polycrystalline M-2 tool steel substrates in accordance with the present invention. In particular, sample ID number 9 exhibits a coating hardness, H$_{nano}$, of 4470 kg/mm². This hardness value compares to the aforementioned measured hardness, H$_{nano}$, of 2910 kg/mm² for TiN homogenous sample layers ID number 7 in Table 3 and 1090 kg/mm² for homogenous NiCr sample layers ID number 10 in Table 4.

While the apparatus of the invention has been illustrated hereabove as comprising opposing first and second magentron cathodes 20, 20', the invention is not so limited and can be practiced using additional magnetron cathodes to effect physical vapor deposition by reactive sputtering. For example, four magnetron cathodes can be spaced 90° apart around the perimeter of a 1 meter diameter coating chamber such that two pairs of opposing magnetron cathodes are provided to achieve higher production of superlattice composite coated substrates. A sputter coating system having such an arrangement of magnetron cathodes is described in BIRL PROGRESS, June, 1991.

While the invention has been described in terms of specific embodiments thereof, it is not intended to be limited thereto but rather only to the extent set forth in the following claims.

The embodiments of the invention in which an exclusive property or privilege is claimed are defined as follows:

1. A coated article comprising, in combination:
   a metal substrate, said substrate having a surface coated with a protective composite coating;
   said coating comprising multiple pairs of layers, each layer comprised of a distinct polycrystalline, stoichiometic metal compound deposited by vapor deposition onto the surface and the layers previously deposited thereon alternating layers of said coating having the same composition, adjacent pairs of layers having a nominal thickness in the range greater than about 2 to about 10 nanometers and said adjacent pairs of layers in combination having a Vickers hardness (Kg/mm²) exceeding about 4000.

2. The article of claim 1 wherein a layer has a thickness in the range of 40 to 60% of the total thickness of the pair of adjacent layers.

3. The article of claim 1 wherein the density of the layers is maintained substantially without voids.

4. The article of claim 1 wherein the coating comprises alternating layers of NbN and TiN.

5. The article of claim 1 including multiple pairs of layers forming the coating.

6. The article of claim 1 wherein the thickness of each pair of adjacent layers is in the range of about 4 to 8 nanometers.

7. The article of claim 1 wherein the metal compounds are taken from the group consisting of nitrites, oxides, carbides and borides.

8. The article of claim 1 wherein the cumulative thickness of the pairs of layers of coating are in the range of 0.05 to 20 microns.

9. The article of claim 1 wherein the thickness of an individual layer, of each pair of layers, is greater than 1.5 nanometers.

* * * * *